(12) United States Patent
Kang

(10) Patent No.: US 6,472,880 B1
(45) Date of Patent: Oct. 29, 2002

(54) ACCURATE VOLTAGE MEASUREMENT SYSTEM USING RELAY ISOLATED CIRCUITS

(75) Inventor: Dennis H. Kang, Cerritos, CA (US)

(73) Assignee: Enova Systems, Torrance, CA (US)

( * ) Notice: Subject to any disclaimer, the term of this patent is extended or adjusted under 35 U.S.C. 154(b) by 0 days.

(21) Appl. No.: 09/895,859

(22) Filed: Jun. 29, 2001

(51) Int. Cl.[7] ............................................. G01N 27/416
(52) U.S. Cl. ...................................................... 324/434
(58) Field of Search ................................. 320/110, 116, 320/132; 324/427, 428, 433, 434, 435

(56) References Cited

U.S. PATENT DOCUMENTS 6,157,171 A * 12/2000 Smith .......................... 320/133

* cited by examiner

Primary Examiner—Edward H. Tso
(74) Attorney, Agent, or Firm—Burns, Doane, Swecker & Mathis

(57) ABSTRACT

A system for measuring voltages of batteries in a battery pack. The system has an isolation circuit operative to isolate a voltage for each of the batteries. A buffer of the system is in electrical communication with the isolation circuit and operative to store the voltage of each of the batteries when the batteries are isolated. The system further includes a voltage measuring device in electrical communication with the buffer. The voltage measuring device is operative to measure the voltage in the buffer and provide a stable measurement of the battery voltages therefrom.

21 Claims, 2 Drawing Sheets

ACCURATE VOLTAGE MEASUREMENT SYSTEM USING RELAY ISOLATED CIRCUITS

BACKGROUND OF THE INVENTION

1. Field of Invention

The present invention relates generally to the measurement of battery voltages and more particularly to the measurement of multiple voltages from multiple batteries of a battery pack.

2. Status of the Prior Art

In order to properly care for a battery, the voltage of the battery must be monitored precisely in order to determine when to charge the battery and the length of time of any charging. Specifically, when the voltage of the battery drops below a predetermined level, usually the battery needs to be charged. Similarly, during charging, the voltage of the battery should be monitored closely in order to avoid overcharging.

Additionally, the temperature of the battery should be monitored in order to ensure that the temperature of the battery is maintained within a desired range. If the temperature of the battery exceeds a prescribed threshold, the life and the capacity of the battery to maintain a charge can be substantially decreased. Additionally, during charging, if the temperature exceeds the prescribed threshold, the battery may not charge properly or may be permanently damaged.

In large power applications such as those found in electric vehicles, typically, multiple batteries are connected together in order to provide the necessary power. The batteries will be connected together either serially or in parallel as needed by the application and form a battery pack. It is not uncommon for the battery pack to have up to 28 individual batteries.

As will be recognized by those of ordinary skill in the art, it is awkward to measure the voltages of each of the batteries of the battery pack. The voltage measurement must be performed in a timely manner in order to ensure detection of any voltage change and provide compensation. If only one voltage measuring device is used to measure the voltage on multiple batteries, the time to switch the measurement device between the batteries may be relatively long, thereby preventing optimal voltage detection. Furthermore, if a measurement device is provided for each battery, the cost of measuring the voltage increases due to the increased part count. It will be recognized that the total output voltage of the battery pack can also be measured. However, this measurement may result in a very inaccurate reading because it will be the sum of all the voltages of the battery and will not indicate whether an individual battery has been overcharged or undercharged or even if the battery is operating.

During measurement of the battery voltage, it is necessary for the voltage to be stable in order to obtain an accurate measurement. If the voltage is measured directly from the battery during charging or discharging, the voltage may fluctuate greatly due to the load placed on the battery thereby resulting in an inaccurate reading. Accordingly, for a truly accurate reading, the battery should be isolated from the load during voltage measurements.

With the need for vehicles to become more environmentally friendly, automakers are creating hybrid, mini-hybrid, fuel cell and electric vehicles which utilize a battery as an energy storage device. In the electric or fuel cell vehicle, the battery powers electric motors which propel the car. The batteries are charged either through regenerative braking and/or an outside source of electrical power such as a fuel cell. Hybrid and mini-hybrid vehicles do not use an outside source of power to charge the batteries. In hybrid vehicles, a small engine is used to charge the batteries and propel the vehicle. Electric motors are also used to propel the hybrid vehicle. As such, the battery pack is relatively large and provides around 300 volts. Mini-hybrid vehicles use a small battery pack having about 42 volts that is used to power an integrated starter generator of the conventional engine. In both hybrid and mini-hybrid vehicles, the battery is charged via the engine and regenerative braking.

It will be recognized that it is imperative to fully monitor the voltage from the batteries of the electric, fuel cell, hybrid and mini-hybrid vehicles. In order to improve the life expectancy of the batteries, and decrease service and replacement thereof, the voltage of each of the batteries should be closely monitored. Additionally, due to charging via regenerative braking, the batteries are subject to multiple short periods of charging and discharging. Accordingly, the battery voltages must be constantly monitored in order for the batteries to function properly and to prolong the life expectancy thereof.

The present invention addresses the above-mentioned deficiencies in the prior art voltage measurement systems by providing a system and method which accurately measures the voltage of each of the batteries of a battery pack. More specifically, the present invention provides a system which is capable of isolating the voltage of an individual battery during the measurement process. Additionally, the present invention provides a system which measures the voltage of multiple batteries without the need for a measurement device for each individual battery or a single measurement device that measures only the total pack voltage. As such, the present invention provides an efficient voltage measurement system for accurately determining the voltage of each battery in a multiple battery pack.

BRIEF SUMMARY OF THE INVENTION

In accordance with a preferred embodiment of the present invention, there is provided a system for measuring voltages of batteries in a battery pack. The system includes an isolation circuit that is operative to isolate a voltage from each of the batteries and a buffer in electrical communication with the isolation circuit. The buffer is operative to store the voltage of each of the batteries when the batteries are isolated. A voltage measuring device of the system is in electrical communication with the buffer. The voltage measuring device is operative to measure the voltages in the buffer in order to provide a stable measurement of the battery voltages.

In the preferred embodiment of the present invention, each battery will have its own isolation circuit. The battery pack will be configured into multiple banks of batteries and the system will have a buffer for each battery of each bank.

In this regard, each buffer will have a number of inputs corresponding to the number of banks of batteries. Similarly, the system will include a voltage measuring device for each of the buffers such that the number of buffers will equal the number of voltage measuring devices.

In accordance with the present invention, the system will further include a controller (i.e., microcontroller or microprocessor) operative to control the isolation circuits, the buffers and the voltage measuring devices. The controller operates the components such that the battery voltages for each bank of batteries will be sequentially determined.

The controller may also be operative to monitor the temperature of the battery pack via a temperature sensor. In the preferred embodiment, the system will contain twelve temperature sensors.

It will be recognized that each isolation circuit may contain a relay to isolate the battery from the buffer. Disposed between the relay and the buffer will be an energy storage device operative to store the voltage of the battery after the battery has been isolated from the buffer. In this regard, the energy storage device may be a capacitor.

In accordance with the present invention, the measurement system may measure the voltage of l batteries configured in m battery banks. Each battery bank has n batteries. The system will then have l isolation circuits for each of the l batteries. Furthermore, the system will have n buffers operative to store the voltage of the batteries when isolated. Finally, the system will have n voltage measuring devices for each of the n buffers. In the preferred embodiment, there will be a total of twenty-eight batteries configured into four banks such that each bank will have seven batteries. Accordingly, the system will contain 28 isolation circuits, seven buffers and seven voltage measuring devices.

In accordance with the present invention, there is provided a method of measuring the voltages of batteries in a battery pack. The method begins by storing the voltage of a respective one of the batteries in an energy storage device such as a capacitor. Next, the battery is isolated from the energy storage device and the voltage is stored in a buffer. Finally, the voltage is measured from the buffer in order to provide a stable voltage measurement for the battery.

BRIEF DESCRIPTION OF THE DRAWINGS

These, as well as other features of the present invention will become more apparent upon reference to the drawings wherein.

DETAILED DESCRIPTION OF THE INVENTION

Figures 1, 2:
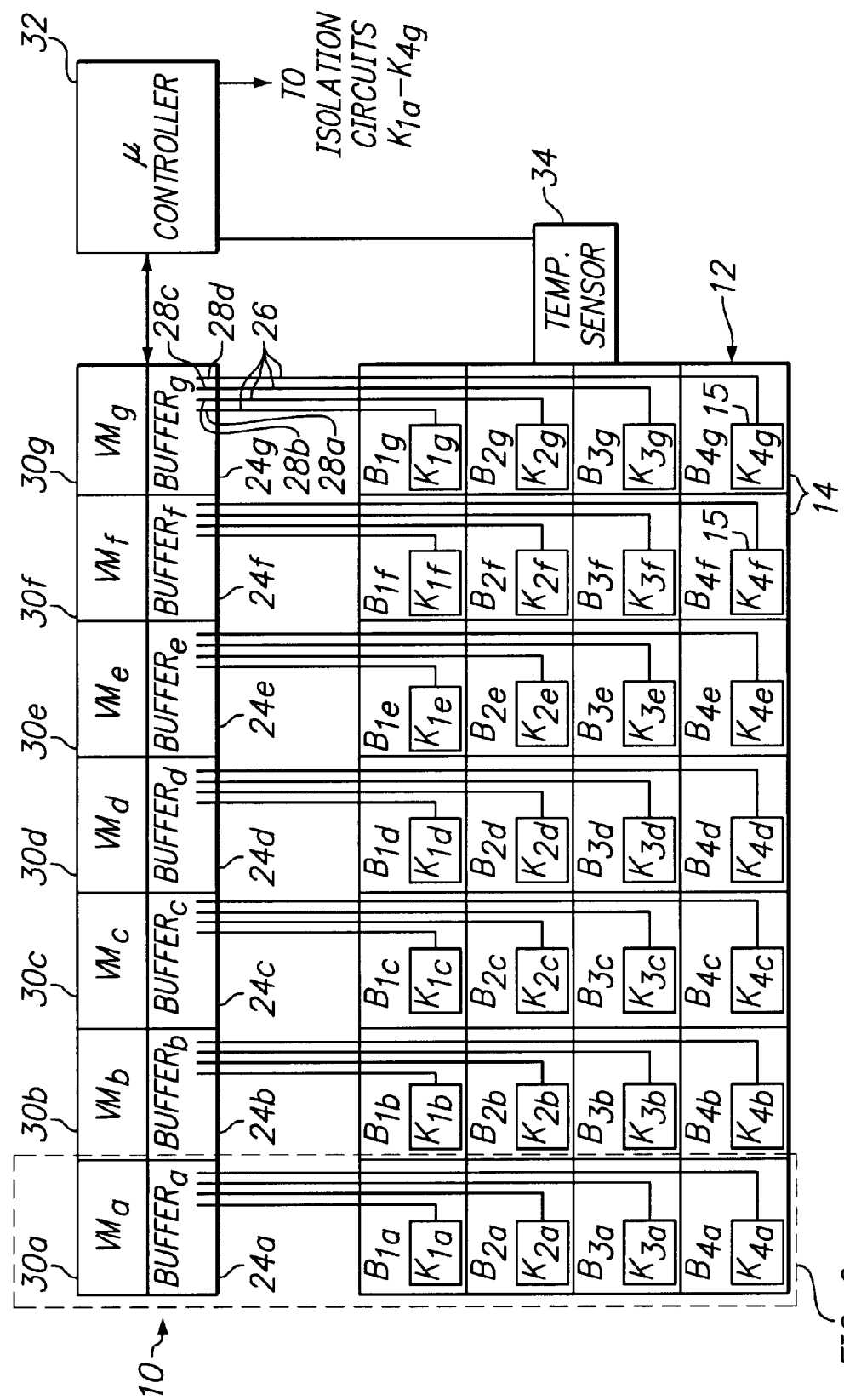
FIG. 1 is a schematic illustration of a voltage monitoring system constructed in accordance with the preferred embodiment of the present invention.
FIG. 2 is an exploded view of a section of the voltage monitoring system shown in FIG. 1.
Figure 2:
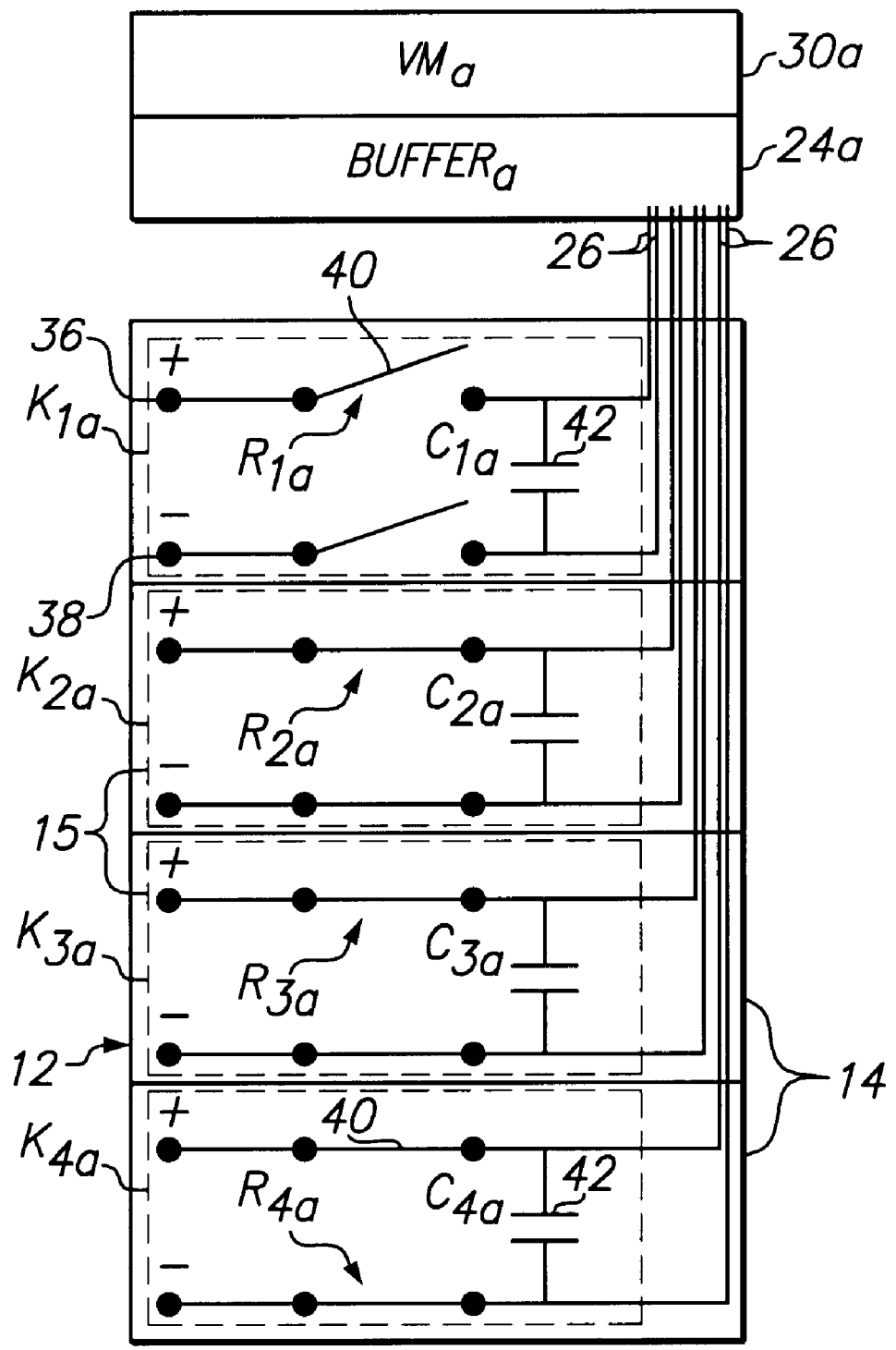

Referring now to the drawings wherein the showings are for purposes of illustrating a preferred embodiment of the present invention only, and not for purposes of limiting the same, FIG. 1 illustrates a voltage measurement system for monitoring the voltage of a battery pack 12. More specifically, the battery pack 12 comprises a series of individual batteries 14 interconnected together either serially or in parallel (not shown for clarity) that provides power to a device such as an electric motor (not shown) for an electric vehicle. The battery pack 12 is configured into four banks 16, 18, 20 and 22. Each of the banks, 16, 18, 20 and 22 has seven batteries 14. More specifically, bank 16 contains batteries 14 labeled $B_{1a}$, $B_{1b}$, $B_{1c}$, $B_{1d}$, $B_{1e}$, $B_{1f}$, and $B_{1g}$. Similarly, banks 18–22 contain respective batteries (i.e., $B_{2a}-B_{2g}$, $B_{3a}-B_{3g}$, and $B_{4a}-B_{4g}$). In the present example, the battery pack 12 contains twenty-eight batteries 14.

The voltage measurement system 10 includes an isolation circuit 15 for each of the batteries 14. Each isolation circuit 15 is operative to isolate the voltage on a respective battery 14 therefrom, as will be further explained below. Accordingly, an isolation circuit 15 is associated with each of the batteries 14 and is in electrical communication with the positive and negative terminals of the respective battery 14. As seen in FIG. 1, there are twenty-eight isolation circuits 15 corresponding to each battery 14 (i.e., $K_{1a}-K_{1g}$, $K_{2a}-K_{2g}$, $K_{3a}-K_{3g}$, and $K_{4a}-K_{4g}$).

The measurement system 10 further includes seven buffers $2_{4a}-2_{4g}$. Each of the buffers 24a–24g has a voltage monitoring line 26 connecting a buffer 24a–24g to a respective one of the isolation circuits 15. More specifically, each buffer 24a–24g has four inputs 28a, 28b, 28c, and 28d connected to a respective one of the monitoring lines 26 which in turn is connected to a respective isolation circuit 15. For example, each of the inputs 28a–28d of buffer 24a is connected to respective isolation circuits $K_{1a}$, $K_{2a}$, $K_{3a}$, and $K_{4a}$. As seen in FIG. 1, the buffer 24a is therefore connected to the first battery 14 (i.e., $B_{1a}$, $B_{2a}$, $B_{3a}$, and $B_{4a}$) in order to monitor the voltage of the first battery 14 in each battery bank 16, 18, 20, 24 in a manner to be described below. Similarly, buffer 24b is connected to the second battery 14 (i.e., $B_{1b}$, $B_{2b}$, $B_{3b}$ and $B_{4b}$) of the battery banks 16, 18, 20, and 24 and the buffer 24c is connected to the third battery 14 (i.e., $B_{1c}$, $B_{2c}$, $B_{3c}$ and $B_{4c}$) in each battery bank 16, 18, 20 and 24. Accordingly, each buffer 24a–24g is connected to the same corresponding battery 14 in each of the battery banks 16, 18, 20 and 22.

Referring to FIG. 1, each of the buffers 24a–24g is in electrical communication with a respective voltage measuring device (i.e., voltmeter) 30a–30g. Each of the voltage measuring devices 30a–30g can measure the voltage from a respective one of the batteries 14 which is in electrical communication with the respective buffer 24a–24g. For example, voltage measuring device 30a can measure the voltage from batteries $B_{1a}$, $B_{2a}$, $B_{3a}$, and $B_{4a}$, while voltage measuring device 30b can measure the voltage from batteries $B_{1b}$, $B_{2b}$, $B_{3b}$, and $B_{4b}$. As will be further explained below, each of the buffers 24a–24g can present a single voltage from the batteries 14 for measurement by the voltage measuring device 30a–30g. Therefore, the buffers 24a–24g can present the voltages from a battery bank 16, 18, 20, and 24 at the same time to the voltage measuring devices 30a–30g such that the voltage for each battery 14 of the respective battery bank 16, 18, 20 and 24 can be measured.

In order to control the operation of the battery measurement system 10, a microcontroller (or microprocessor) 32 is connected to the buffers 24a–24g, the voltage measurement devices 30a–30d and the isolation circuits 15. The microcontroller 32 is operative to control the operation of the isolation circuits 15 in order to properly measure the voltage of each of the batteries 14, as will be further explained below. Furthermore, the microcontroller 32 controls the operations of the buffers 24a–24g in order to properly present the voltages to the voltage measuring devices 30a–30g. The microcontroller 32 additionally is in electrical communication with at least one temperature sensor 34. The temperature sensor 34 can monitor the temperature of the battery pack 12 to ensure that it does not overheat during the recharging process. In the preferred embodiment, twelve temperature sensors 34 are located at critical locations of the battery pack 12 in order to determine the temperature thereof.

In the preferred embodiment of the system 10, the microcontroller 32 is operative to compensate for errors in the measurement of the voltage of the batteries 14. Specifically, each of the voltage measuring devices 30a–30g has an error that can be predetermined. The error can be found by applying a highly accurate voltage (via a voltage divider) to each measuring device 30a–30g. The microcontroller 32 can be programmed to compensate for the error of each measuring device 30a–30g thereby producing a very accurate voltage measurement.

Referring now to FIG. 2, an exploded view of the area enclosed by dashed lines in FIG. 1 is shown. The exploded view of FIG. 2 illustrates a single voltage measuring device 30a with associated buffer 24a and batteries $B_{1a}$, $B_{2a}$, $B_{3a}$, and $B_{4a}$. In the preferred embodiment of the present invention, each battery 14 has a positive terminal 36 and a negative terminal 38. Each of the positive and negative terminals 36 and 38 are connected to conditioning circuits (not shown) for the application that the battery pack 12 is used. For instance, if the battery pack 12 is used in an electric, fuel cell, hybrid, or mini-hybrid vehicle, the terminals 36 and 38 would be connected to regulating circuitry for charging and discharging the batteries 14. As seen in FIG. 2, the positive and negative terminals 36 and 38 are also connected to a respective relay 40. The relay 40 is operative to isolate the terminals 36 and 38 from the buffer 24a. In this respect, the relay 40 can be a double pole, double throw switch or any other type of switch. The operation of the relay 40 is controlled via the microcontroller 32 such that the microcontroller 32 opens and closes the relay, as will be further explained below.

Connected between the relay 40 and the buffer 24a is a capacitor 42 that is operative to store the charge on the battery 14. Specifically, the charge on the capacitor 42 will follow the voltage of the battery 14 until the relay 40 is in the open position, at which time, the capacitor 42 will store the battery voltage. As such, with the relay 40 in the open position (as seen for relay $R_{1a}$ in FIG. 2), it is possible to detect the voltage of the battery 14 in a stable condition. The relay 40 and the capacitor 42 define the isolation circuit 15 and as such are provided for each battery 14. The isolation circuit 15 may be located near the battery 14 (as shown) or at any other convenient location of the system 10 (i.e., with the buffers 24a–24g).

As previously mentioned above, the load on the battery 14 will be fluctuating such that the voltage may not be steady. However, by opening the relay 40, the capacitor 42 is isolated from the battery 14 and a stable measurement of the voltage of the battery 14 can be made from the voltage across the capacitor 42. Each pair of lines from the capacitor 42 define the voltage monitoring line 26 and are inputted into the buffer 24a, as seen in FIG. 2. The voltage monitoring lines 26 provide the charge from a respective capacitor 42 to buffer 24a for storage and then measurement by the voltage measuring device 30a.

Having described the parts of the measurement system 10, now the preferred operation will be discussed. In the preferred embodiment of the present invention, the voltage of all the batteries of a battery bank 16, 18, 20 and 22 will be measured simultaneously. In other words, the voltages of the batteries in the first bank 16 (i.e., batteries: $B_{1a}$, $B_{1b}$, $B_{1c}$, $B_{1d}$, $B_{1e}$, $B_{1f}$, and $B_{1g}$) will be simultaneously measured. Next the batteries of the second bank 18 will be measured. This process repeats for all the banks and continues with the first bank 16 when the last bank 22 has been measured.

In order to measure the voltages of the batteries 14 of the first bank 16, the microcontroller 32 opens all of the relays for the batteries of the first bank 16 and closes the relays for the batteries of banks 18, 20 and 22. As previously mentioned, each of the batteries of the first bank 16 are isolated such that the voltage across the capacitor 42 provides a stable reading of the voltages.

Next, the microcontroller 32 will control the buffers 24a–24g to input the readings from the first bank 16 of batteries 14 and to store such reading. The voltage measuring devices 30a–30g will measure the voltage of the first bank 16 of batteries 14 stored in respective buffers 24a–24g. Each of the measuring devices 30a–30g will output a respective voltage reading to the microcontroller 32 which can compensate for the measurement based upon the error previously determined. The voltages will be outputted from the microcontroller 32 to the appropriate charging or discharging device for analysis.

After the voltage for each of the batteries of the first bank 16 has been found, the microcontroller 32 will proceed to measure the voltage for the batteries 14 of the second bank 18. Accordingly, the relays 40 for the first bank 16 will be closed and the relays 40 for the second bank 18 will be open and the voltages will be measured. This procedure is repeated for the remaining banks 20 and 22 of the battery pack 12. In the preferred embodiment of the present invention, all four battery packs 16, 18, 20 and 22 can be measured once a second. Accordingly, the present invention provides a highly accurate system for measuring the voltages on multiple batteries very quickly and efficiently without the need for a high part count. Additionally, the error in the voltage measurement can be compensated in order to find a highly accurate measurement.

Additional modifications and improvements of the present invention may also be apparent to hose of ordinary skill in the art such as having more or less batteries and/or more or less battery banks. Thus, the particular combination of parts described and illustrated herein is intended to represent only a certain embodiment of the present invention, and is not intended to serve as limitations of alternative devices within the spirit and scope of the invention.

What is claimed is:

1. A system for measuring voltages of batteries in a battery pack, the system comprising:
   an isolation circuit having a relay and operative to isolate a voltage of each of the batteries;
   a buffer in electrical communication with the isolation circuit and operative to store the voltage of each of the batteries when the batteries are isolated from the buffer by the relay; and
   a voltage measuring device in electrical communication with the buffer, the voltage measuring device being operative to measure the voltages in the buffer and provide a stable measurement of the battery voltages therefrom.

2. The system of claim 1 wherein each battery has an isolation circuit.

3. The system of claim 2 wherein the battery pack is configured into multiple banks of batteries and the system further comprises a buffer for each battery of each bank.

4. The system of claim 3 wherein the buffer has inputs corresponding to the number of banks of batteries.

5. The system of claim 4 further comprising a voltage measuring device for each of the buffers.

6. The system of claim 5 further comprising a controller operative to control the isolation circuits, the buffers, and the voltage measuring devices.

7. The system of claim 6 wherein the controller is programmed to control the isolation circuits, the buffers, and the voltage measuring devices to measure the voltages of the batteries of each respective bank of batteries sequentially.

8. The system of claim 1 wherein the isolation circuit further comprises an energy storage device operative to store the voltage of the battery when the battery is isolated from the buffer.

9. The system of claim 8 wherein the energy storage device is a capacitor.

10. The system of claim 1 wherein the battery pack is configured for an electric or fuel cell vehicle.

11. A voltage measurement system for l batteries configured in m battery banks, each battery bank having n batteries, the measurement system comprising:

l isolation circuits, each of the isolation circuits in electrical communication with a respective one of the l batteries and having a relay and an energy storage device;

n buffers, each of the n buffers in electrical communication with a respective one of the l isolation circuits and operative to store the voltage of the battery when isolated; and n voltage measuring devices in electrical communication with a respective one of the n buffers, each voltage measuring device being operative to measure the voltage in the respective buffer and provide a stable measurement of the battery voltage therefrom.

12. The system of claim 11 wherein the energy storage device is a capacitor.

13. The system of claim 11 wherein the relay is a switch.

14. The system of claim 11 further comprising a controller operative to isolate the batteries in order to measure the voltage thereof.

15. The system of claim 14 wherein the controller is operative to isolate all the batteries of one of the m battery banks in order to measure the voltage thereof.

16. The system of claim 15 wherein the controller is operative to measure the voltages of the batteries in each of the m battery banks sequentially.

17. A method of measuring the voltages of batteries in a battery pack, the method comprising the steps of:

a) storing the voltage of a respective one of the batteries in a capacitor;

b) isolating the battery from the energy storage device with a relay;

c) storing the voltage from the energy storage device in a buffer; and d) measuring the voltage from the buffer with a voltage measuring device.

18. The method of claim 17 wherein steps (a)–(d) are controlled via an electronic controller.

19. The method of claim 17 further comprising the step of measuring the temperature of the battery pack in order to ensure proper operation thereof.

20. The method of claim 17 wherein the battery pack comprises n banks of m batteries for a total of n×m batteries of the battery pack, and wherein:

step (a) comprises storing the voltage of a respective one of the batteries in one of l×m capacitors;

step (b) comprises isolating the battery from a respective energy storage device via one of a l×m relays;

step (c) comprises storing the voltage from the capacitor in one of m buffers; and step (d) comprises measuring the voltage from the buffer with one of m measuring devices.

21. A system for measuring voltages of batteries in a battery pack, the system comprising:

an isolation circuit operative to isolate a voltage of each of the batteries;

a buffer in electrical communication with the isolation circuit and operative to store the voltage of each of the batteries when the batteries are isolated;

a voltage measuring device in electrical communication with the buffer, the voltage measuring device being operative to measure the voltages in the buffer and provide a stable measurement of the battery voltages therefrom; and a temperature sensor operative to detect the temperature of the battery pack.

* * * * *